United States Patent
Matsumoto et al.

(10) Patent No.: US 9,488,696 B2
(45) Date of Patent: Nov. 8, 2016

(54) VOLTAGE DETECTION APPARATUS

(71) Applicant: KEIHIN CORPORATION, Tokyo (JP)

(72) Inventors: Eishin Matsumoto, Tochigi (JP); Seiji Kamata, Tochigi (JP); Shinichi Sato, Tochigi (JP)

(73) Assignee: KEIHIN CORPORATION, Shinjuku-ku (JP)

( * ) Notice: Subject to any disclaimer, the term of this patent is extended or adjusted under 35 U.S.C. 154(b) by 152 days.

(21) Appl. No.: 14/200,306

(22) Filed: Mar. 7, 2014

(65) Prior Publication Data

US 2014/0292345 A1 Oct. 2, 2014

(30) Foreign Application Priority Data

Mar. 29, 2013 (JP) .................. 2013-072711

(51) Int. Cl.
*G01R 31/36* (2006.01)
*B60L 3/00* (2006.01)
*B60L 3/12* (2006.01)
*B60L 11/18* (2006.01)
*H02J 7/00* (2006.01)
*H01M 10/48* (2006.01)

(52) U.S. Cl.
CPC ......... *G01R 31/3658* (2013.01); *B60L 3/0038* (2013.01); *B60L 3/12* (2013.01); *B60L 11/1866* (2013.01); *H01M 10/482* (2013.01); *H02J 7/0016* (2013.01); *B60L 2240/547* (2013.01); *B60L 2240/549* (2013.01); *G01R 31/362* (2013.01); *G01R 31/3606* (2013.01); *Y02T 10/7005* (2013.01); *Y02T 10/7055* (2013.01); *Y02T 10/7061* (2013.01)

(58) Field of Classification Search
CPC ................. G01R 31/3658; H01M 2010/4271; B60L 11/1866
See application file for complete search history.

(56) References Cited

U.S. PATENT DOCUMENTS

2006/0055373 A1* 3/2006 Bopp .................. G01R 31/362
   320/132
2007/0046292 A1* 3/2007 Plett .................. G01R 31/3624
   324/429

(Continued)

FOREIGN PATENT DOCUMENTS

JP 2010-243157 A 10/2010
JP 2012-159406 A 8/2012

(Continued)

*Primary Examiner* — Samuel Berhanu
*Assistant Examiner* — Tarikh Rankine
(74) *Attorney, Agent, or Firm* — Westerman, Hattori, Daniels & Adrian, LLP

(57) ABSTRACT

A voltage detection apparatus comprises discharge circuits constituted by switch elements and resistors connected in series, and respectively connected in parallel to each of a plurality of battery cells constituting a storage battery, filter circuits provided for the respective battery cells and removing noise contained in voltage inputted by the battery cells, and voltage detection units (D) and (M) which detect voltage of the respective battery cells in which noise is removed by the filter circuits. The voltage detection units correct detection results, based on time from when the switch elements of the discharge circuits change into an OFF state to timing for detecting voltage of the battery cells. With this voltage detection apparatus, it is possible to correct the detection error of the voltage of the battery cell due to the influence of the filter circuit, thus improving the detection accuracy of the voltage of the battery cell.

2 Claims, 3 Drawing Sheets

(56) References Cited

U.S. PATENT DOCUMENTS

| | | | |
|---|---|---|---|
| 2011/0260770 A1* | 10/2011 | Sekiguchi | G01R 31/362 327/333 |
| 2011/0267009 A1* | 11/2011 | Nakatsuji | H01M 2/34 320/152 |
| 2012/0025835 A1* | 2/2012 | Chandler | G01R 19/16542 324/433 |
| 2012/0303301 A1* | 11/2012 | Park | G01R 31/3662 702/63 |
| 2014/0266050 A1* | 9/2014 | Biskup | H02J 7/0021 320/118 |

FOREIGN PATENT DOCUMENTS

| | | |
|---|---|---|
| JP | 2012-159407 A | 8/2012 |
| JP | 2012-172992 A | 9/2012 |

* cited by examiner

VOLTAGE CHANGE BASED ON TIME CONSTANT OF FILTER CIRCUIT

VOLTAGE DETECTION APPARATUS

CROSS REFERENCES TO RELATED APPLICATIONS

The present application claims priority under 35 U.S.C. §119 to Japanese Patent Application No. 2013-072711, filed Mar. 29, 2013, entitled "Voltage Detection Apparatus." The contents of this application are incorporated herein by reference in their entirety.

TECHNICAL FIELD

The present disclosure relates to a voltage detection apparatus.

DESCRIPTION OF THE RELATED ART

Japanese Patent Application Laid-Open No. 2012-172992, a power storage apparatus for equalizing the voltage of all the battery cells and accurately detecting disconnection of the voltage detection line is disclosed. Such a power storage apparatus includes equalization discharge circuits for causing a battery cell in an overcharged state to discharge, filter circuits (RC filter circuits) which are provided for the respective battery cells and remove the noise contained in the voltage inputted by the battery cells, voltage detection circuits for detecting the voltage of the respective battery cells in which the noise is removed by the filter circuits, and a CPU (Central Processing Unit) which controls the overall operation of the power storage apparatus based on the detection result of the voltage detection circuit. In the case where an external drive motor (load) is in a process-stopped state, or in the case where the maximum voltage exceeds a threshold among all the battery cells, the above-mentioned CPU disables the operation of the equalization discharge circuit, detects the voltage of a cell according to the voltage of a capacitor constituting of the filter circuit, and in the case where the voltage of the battery cell immediately above the battery cell as a disconnection detection object is higher than a first predetermined value and the voltage of the battery cell as the detection object is lower than a second predetermined value, determines that the voltage detection line is disconected.

SUMMARY

However, in the prior art described above, the filter circuit for removing the noise is provided between the battery cell and the voltage detection circuit, that is, the voltage detection circuit detects the voltage of the battery cell via the filter circuit. Compared with the case of directly detecting the voltage of the battery cell, an error is generated due to the influence of the filter circuit, and thus, there is a problem that the voltage detection accuracy of the battery cell drops.

Therefore, it is preferable to correct the detection error of the voltage of the battery cell due to the influence of the filter circuit, thus improving the detection accuracy of the voltage of the battery cell.

In the first aspect of the present disclosure, a voltage detection apparatus comprises: discharge circuits which are constituted by switch elements and resistors connected in series, and are respectively connected in parallel to each of a plurality of battery cells constituting a storage battery; filter circuits which are provided for the respective battery cells and remove noise contained in voltage inputted by the battery cells; and voltage detection units which detect voltage of the respective battery cells in which noise is removed by the filter circuits, wherein the voltage detection units correct detection results, based on time from when the switch elements of the discharge circuits change into an OFF state to timing for detecting voltage of the battery cells.

In the second aspect, the filter circuit is a low-pass filter circuit constituted by a resistor and a capacitor, and the voltage detection unit correct detection result, based on the time and time constant of the filter circuit.

According to one or more of the above aspects of the present disclosure, the voltage detection units correct the detection results, based on the time from when the switch elements of the discharge circuits change into an OFF state to the timing for detecting the voltage of said battery cells. Consequently, it is possible to correct the detection error of the voltage of the battery cell due to the influence of the filter circuit, thus improving the detection accuracy of the voltage of the battery cell.

DESCRIPTION OF THE EMBODIMENTS

Embodiments of the present invention will be described below with reference to the accompanying drawings.

Figure 1:
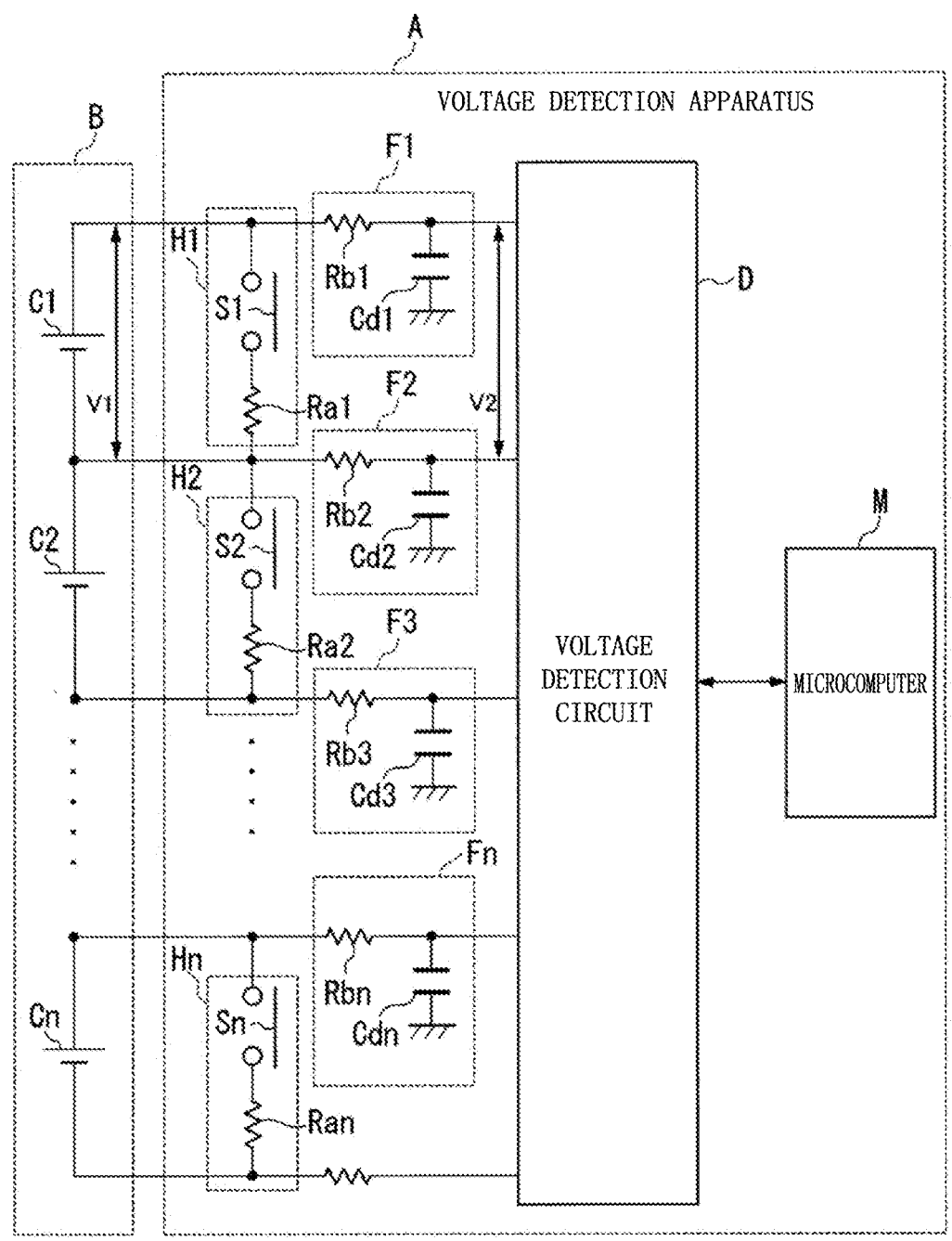
FIG. 1 is a schematic configuration diagram of a voltage detection apparatus A according to one embodiment of the present invention.

A voltage detection apparatus A according to the present embodiment is mounted on a mobile vehicle such as an electric vehicle (EV) or a hybrid vehicle (HV), and monitors the voltage state of the respective battery cells C1-Cn constituting a storage battery B. As shown in FIG. 1, the voltage detection apparatus A comprises: discharge circuits H1-Hn, filter circuits F1-Fn, a voltage detection circuit D and a microcomputer M. In addition, the voltage detection circuit D and the microcomputer M constitutes a voltage detection unit of the present embodiment.

The discharge circuits H1-Hn are connected in parallel to the respective battery cells C1-Cn, and causes the battery cells C1-Cn in an overcharged state to discharge, based on a control signal inputted from the microcomputer M. As shown in FIG. 1, the discharge circuits H1-Hn are constituted by switch elements S1-Sn and first resistors Ra1-Ran. In addition, the discharge circuits H1-Hn have the same configuration, thus a description will be given of only the switch element S1 and the resistor R1 of the discharge circuit H1, and description of the switch elements S2-Sn and the first resistors Ra2-Ran of the discharge circuits H2-Hn will be omitted.

The switch element S1 is, for example, a bipolar transistor, in which a base terminal is connected to the microcomputer M, an emitter terminal is connected to the positive pole of the battery cell C1, and a collector terminal is connected to one end of the first resistor Ra1. When the voltage value from the microcomputer M is a high-level control signal and is inputted to the base terminal, the switch element S1 is in an ON state, and the power of the battery cell C1 in the overcharged state is discharged to the first resistor Ra1. On the other hand, when the voltage value is a low-level control signal and is not inputted to the base terminal, the switch element S1 is in an OFF state, and the battery cell C1 stops the discharge to the first resistor Ra1.

Further, in addition to a bipolar transistor, the switch element S1 can also be, for example, a field effect transistor (FET) and an insulated gate bipolar transistor (IGBT).

One end of the first resistor Ra1 is connected to the collector terminal of the switch S1, and the other end thereof is connected to the negative pole of the battery cell C1. When the switch element S1 is in the ON state, power is inputted to the first resistor Ra1 from the battery cell C1, and the power is converted into thermal energy (that is, heat is generated).

The filter circuits F1-Fn is low-pass filter circuits for removing the noise contained in the voltage outputted from the respective battery cells C1-Cn. The filter circuits F1-Fn are respectively provided between each of the battery cells C1-Cn and each of the voltage detection circuits D. As shown in FIG. 1, the filter circuits F1-Fn are constituted by second resistor Rb1-Rbn and capacitors Cd1-Cdn.

In addition, the filter circuits F1-Fn have the same configuration, thus a description will be given of only the second resistor Rb1 and the capacitor Cd1 of the filter circuit F1, and description of the second resistors Rb2-Rbn and the capacitors Cd2-Cdn of the filter circuits F2-Fn will be omitted.

One end of the second resistor Rb1 is connected to the emitter terminal of the switch element S1 and the positive pole of the battery cell C1, and the other end thereof is connected to one end of the capacitor Cd1 and one of a plurality of input terminals provided on the voltage detection circuit D.

One end of the capacitor Cd1 is connected to the other end of the second resistor Rb1 and one input terminal of the voltage detection circuit D, and the other end of the capacitor Cd1 is connected to ground.

The voltage detection circuit D is a dedicated IC chip which has an A/D conversion function of measuring the voltage of each battery cell C and converting the measurement result into digital data (voltage detection data), and a communication function of communicating with the microcomputer M. The voltage detection circuit D can be operated by a power of a high voltage (e.g., 60 V). Via an insulation element such as a photocoupler, this voltage detection circuit D is connected to the microcomputer M which can be operated by only a low voltage (e.g., 5 V), thereby enabling this voltage detection circuit D to communicate with this microcomputer M while being electrically insulated from the microcomputer M.

The microcomputer M is an IC chip. This IC chip includes a central processing unit (CPU), a read only memory (ROM), a random access memory (RAM), an interface circuit which is electrically connected to each portion described above and receives/transmits various signals from/to each of said portions, and the like. The microcomputer M is connected to the voltage detection circuit D via the above-mentioned insulation element, and can communicate with this voltage detection circuit D.

This microcomputer M performs various arithmetic processes based on various arithmetic control programs stored in the above-mention ROM, while controlling the overall operation of the voltage detection apparatus A by communicating with each portion. As will be described in detail later, the voltage detection circuit D generates an error due to the influence of the filter circuits F1-Fn, and the microcomputer corrects the voltage detection data inputted from the voltage detection circuit D.

Next, the operation of the voltage detection apparatus A configured in the above-mentioned manner will be described with reference to FIG. 2 and FIG. 3.

Figure 2:
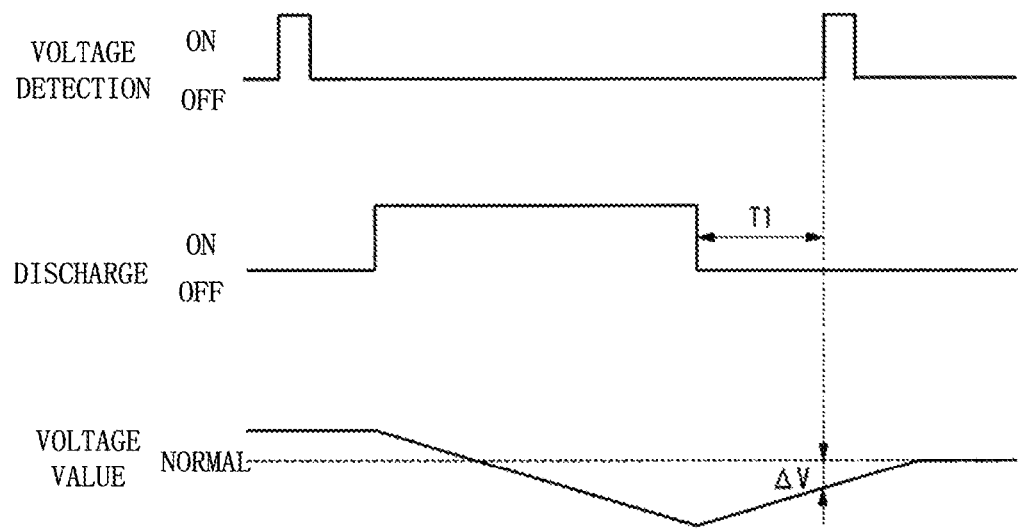
FIG. 2 is a timing chart showing the operation of the voltage detection apparatus A according to one embodiment of the present invention.
Figure 3:
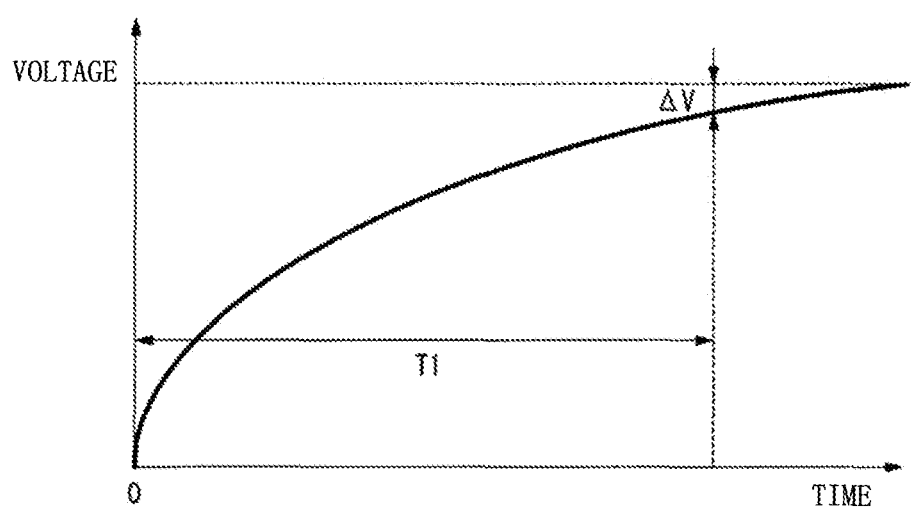
FIG. 3 is a graph showing the relationship between the time T1 and the voltage error ΔV which are calculated by the voltage detection apparatus A according to one embodiment of the present invention.

As shown in the timing chart in FIG. 2, the microcomputer M detects the voltage of the respective battery cells C1-Cn at a predetermined time interval. That is, the microcomputer M acquires the voltage of the respective battery cells C1-Cn, based on the voltage detection data inputted from the voltage detection circuit D at the pre-assigned timing. In addition, in the timing chart of voltage detection as shown in FIG. 2, "ON" indicates the timing for detecting the voltage, and "OFF" indicates the timing when there is no voltage detection.

Subsequently, upon detecting the voltage of the respective battery cells C1-Cn, the microcomputer M determines whether the respective battery cells C1-Cn are in the overcharged state based on this detection result, and causes the battery cells C1-Cn in the overcharged state to discharge, by using the discharge circuits H1-Hn. For example, when the battery cell C1 is in the overcharged state, the microcomputer M makes the switch element S1 be set in the ON state, and discharges the power of the battery cell C1 to the first resistor Ra1.

At this time, the microcomputer M calculates the time during which the switch element S1 is set in the ON state, sets the switch element S1 in the ON state only within the calculated time, and sets the switch element S1 in the OFF state after this time has elapsed, thus causing only the overcharged power of the battery cell C1 to be discharged. As a result, it is possible to eliminate the overcharging of the battery cell C1. In addition, in the timing chart of discharging as shown in FIG. 2, "ON" indicates the timing when discharging is in progress, and "OFF" indicates the timing when no discharging is being performed. For example, in the timing chart of discharging shown in FIG. 2, in the case of "ON", the switch element S1 is in the ON state, and in the case of "OFF", the switch element S1 is in the OFF state.

Subsequently, at the timing for detecting the voltage of the battery cells C1-Cn, the microcomputer M corrects the detection result, based on the time from when the switch elements S1-Sn of the discharge circuits H1-Hn change into the OFF state to the timing for detecting the voltage of the battery cells C1-Cn.

For example, in the case where the switch element S1 is set in the ON state and the overcharged power of the battery cell C1 is discharged to the first resistor Ra1, as shown in FIG. 2, the microcomputer M measures the time (time T1 as shown in FIG. 2) from when the switch element S1 is set in the OFF state after the discharging is completed to the timing for detecting the voltage of the battery cell C1.

Then, the microcomputer M calculates the voltage error $\Delta V$ based on the measured time T1, and adds the voltage error $\Delta V$ to the voltage value of the battery cell C1 which is acquired based on the voltage detection data inputted from the voltage detection circuit D. The microcomputer M sets the above-mentioned voltage value obtained as a result of the addition, as the voltage value of the battery cell C1.

The voltage of the battery cell C1 detected by the microcomputer M based on the voltage detection data inputted from the voltage detection circuit D rises in response to the time T1. This voltage is determined by a time constant of the filter circuit F1, and as in the graph shown in FIG. 3, this voltage changes in response to the time T1. That is, there is a correlation decided according to the time constant of the filter circuit F1, between the voltage error $\Delta V$ and the time T1 (see FIG. 3). For example, the microcomputer M previously stores a data table in which the time T1 and the voltage error ΔV are registered in association with each other, and after the measurement of the time T1, obtains the voltage error ΔV by referring to the data table. Then, the microcomputer M adds the voltage error ΔV to the voltage value of the battery cell C1 which is acquired based on the voltage detection data inputted from the voltage detection circuit D, to correct the voltage value of the battery cell C1 of which an error is generated due to the influence of the filter circuit F1.

According to the present embodiment, the microcomputer M corrects the detection result, based on the time from when the switch elements S1-Sn of the discharge circuits H1-Hn change into the OFF state to the timing for detecting the voltage of the battery cells C1-Cn. Consequently, the detection error of the voltage of the battery cells C1-Cn generated due to the influence of the filter circuits F1-Fn is corrected, and thus the detection accuracy of the voltage of the battery cells C1-Cn can be improved.

That is, according to the present embodiment, it is possible to correct the voltage value (voltage value V2 shown in FIG. 1) of the battery cells C1-Cn of which an error is generated due to the influence of the filter circuit F1, to a voltage value which is approximate to the inter-terminal voltage (voltage value V1 shown in FIG. 1) of the battery cells C1-Cn, thus enabling the detection accuracy of the voltage of the battery cells C1-Cn to be improved.

The embodiments of the present invention have been described, but the present invention is not limited to these embodiments. For example, the following modifications can also be considered.

In the embodiments described above, an RC low-pass filter circuit is used as the filter circuits F1-Fn, but the present invention is not limited to this. In addition to the RC low-pass filter circuit, it is also possible to utilize a low-pass filter circuit using an operational amplifier or a low-pass filter circuit constituted by a reactor and a capacitor, as the filter circuits F1-Fn, and the voltage detection apparatus A using such filter circuits F1-Fn is also applicable to the present invention. In this case, the microcomputer M obtains the voltage error ΔV based on the correlation between the time T1 and the voltage error ΔV, which is decided according to a time constant of the low-pass filter circuit using the operational amplifier or the low-pass filter circuit constituted by the reactor and the capacitor.

We claim:

1. A voltage detection apparatus comprising:
a storage battery including a plurality of battery cells;
a plurality of discharge circuits, each including a switch element and a resistor connected to the switch in series, and each of the plurality of discharge circuits being connected in parallel to corresponding one of the plurality of battery cells;
a plurality of filter circuits, each provided for corresponding one of the plurality of battery cells and removing noise contained in voltage inputted by the corresponding one of the battery cells; and
a plurality of voltage detection units, each detecting a voltage of corresponding one of the plurality of battery cells in which noise is removed by the filter circuit,
wherein each of the voltage detection units corrects detection result of the voltage of corresponding one of the plurality of battery cells, in accordance with a length of time, wherein the length of time is a difference between a time when the switch element of the discharge circuit changes into an OFF state to a time when detecting the voltage of corresponding one of the plurality battery cells starts,
wherein each of the filter circuit is a low-pass filter circuit constituted by a resistor and a capacitor,
wherein each of the voltage detection units calculates a voltage error in accordance with the length of time and adds the voltage error to the detected voltage of corresponding one of the plurality of battery cells, and
wherein the voltage detection unit calculates a predetermined voltage error using correlation between the length of time and the voltage error, the correlation being defined by a time constant of the low-pass filter circuit.

2. A voltage detection apparatus comprising:
a storage battery including a plurality of battery cells;
a plurality of discharge circuits, each including a switch element and a resistor connected to the switch in series, and each of the plurality of discharge circuits being connected in parallel to corresponding one of the plurality of battery cells;
a plurality of filter circuits, each provided for corresponding one of the plurality of battery cells and removing noise contained in voltage inputted by the corresponding one of the battery cells; and
a voltage detecting CPU configured to detect a voltage of the plurality of battery cells in which noise is removed by the filter circuit,
wherein the voltage detecting CPU is configured to correct detection result of the voltage of the plurality of battery cells, in accordance with a length of time, wherein the length of time is a difference between a time when the switch element of the discharge circuit changes into an OFF state to a time when detecting the voltage of the plurality battery cells starts
wherein each of the filter circuit is a low-pass filter circuit constituted by a resistor and a capacitor,
wherein the voltage detecting CPU calculates a voltage error in accordance with the length of time and adds the voltage error to the detected voltage of the plurality of battery cells, and
wherein the voltage detecting CPU calculates the voltage error using correlation between the length of time and a predetermined voltage error, the correlation being defined by a time constant of the low-pass filter circuit.

* * * * *